United States Patent
Andricacos et al.

(10) Patent No.: US 6,395,164 B1
(45) Date of Patent: May 28, 2002

(54) COPPER SEED LAYER REPAIR TECHNIQUE USING ELECTROLESS TOUCH-UP

(75) Inventors: Panayotis Andricacos, Croton-on-Hudson; James E. Fluegel, Tivoli; John G. Gaudiello, Poughkeepsie; Ronald D. Goldblatt, Yorktown Heights; Sandra G. Malhotra, Beacon; Milan Paunovic, Port Washington, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/414,224

(22) Filed: Oct. 7, 1999

(51) Int. Cl.$^7$ .............................. C25D 7/12; C23C 28/02
(52) U.S. Cl. ...................... 205/157; 205/186; 205/187
(58) Field of Search .................. 427/98, 250, 304, 427/443.1; 205/157, 165, 186, 187; 428/678

(56) References Cited

U.S. PATENT DOCUMENTS

| | | | |
|---|---|---|---|
| 3,801,368 A | | 4/1974 | Fusayama et al. .......... 117/239 |
| 4,919,971 A | | 4/1990 | Chen .......................... 427/98 |
| 5,443,865 A | * | 8/1995 | Tisdale et al. ............... 427/304 |
| 5,576,052 A | * | 11/1996 | Arledge et al. ............... 427/98 |
| 5,824,599 A | | 10/1998 | Schacham-Diamand et al. ........... 438/678 |
| 5,830,533 A | | 11/1998 | Lin et al. ..................... 427/272 |
| 5,866,237 A | | 2/1999 | Angelopoulos et al. ..... 428/209 |
| 5,873,992 A | | 2/1999 | Glezen et al. .............. 205/159 |
| 6,046,106 A | * | 4/2000 | Tran et al. ................... 438/660 |
| 6,065,424 A | * | 5/2000 | Shacham-Diamand et al. .. 118/696 |

OTHER PUBLICATIONS

Cecilia Y. Mak, Electroless Copper Deposition on Metals and Metal Silicides, MRS Bulletin, Aug. 1994.

* cited by examiner

Primary Examiner—Edna Wong
(74) Attorney, Agent, or Firm—Jay H. Anderson

(57) ABSTRACT

An electroless touch-up process for repairing copper metallization deposited in dual damascene structures with high aspect ratios. An initial copper strike layer is produced by directional deposition techniques such that discontinuous sidewall coverage occurs. An evolutionary electroless touch-up process then proceeds to conformally grow the copper layer on all surfaces. The result of the evolutionary process is to produce a continuous copper strike layer that can be used with conventional electroplating techniques.

3 Claims, 4 Drawing Sheets

COPPER SEED LAYER REPAIR TECHNIQUE USING ELECTROLESS TOUCH-UP

BACKGROUND OF THE INVENTION

This invention relates to semiconductor integrated circuit (IC) manufacturing, and more particularly to, copper metallization deposition techniques in dual damascene IC structures.

Copper wiring in the complemetary metal oxide semiconductor (CMOS) backend-of-line (BEOL) has the following advantages over Al(Cu) wiring: significantly lower resistance, higher allowed current density, and increased scalability. Because for copper is very difficult to etch in a process analogous to that used for aluminum metallization, dual damascene structures are typically patterned in the dielectric and then filled with copper metallization. The industry process of choice for copper filling is electroplating. This is so because of cost and for other technological reasons such as improved electromigration and gap fill.

The prerequisite for electroplating features without voids and defects is the existence of a continuous copper (Cu) strike layer. However, as BEOL dual damascene aspect ratios increase, the task of producing a continuous Cu strike layer for Cu electroplating becomes more challenging. Current state-of-the-art Cu physical vapor deposition (PVD) seed layer deposition techniques are directional by definition, and hence coat horizontal surfaces (field area, trench and via bottoms) more effectively than vertical surfaces (via and trench sidewalls). This inherent limitation may result in discontinuous sidewall coverage as dual damascene dimensions approach sub 0.25 micron dimensions with aspect ratios >3:1, and hence incomplete electroplated fill. What is needed, therefore, is a method for repairing incomplete fill areas to create a continuous Cu strike layer.

SUMMARY OF THE INVENTION

In view of the above, the invention provides a simple, cost-effective conformal Cu electroless touch-up process that repairs any type of continuous or non-continuous Cu seed layer, such as deposited by PVD, collimated PVD, ionized PVD, evaporation, etc., and transforms it into a suitable strike layer for Cu electroplating.

According to the method of the invention, plating copper on a substrate is accomplished by depositing a seed layer on the substrate. The substrate is then coated with a solution including a reducing agent to cause a conformal layer of metal to deposit on a portion of the substrate not covered by the seed layer, thereby repairing discontinuities in the seed layer deposited in the depositing step. The coating step is performed by an electroless process. Afterward, an electroplating process can be performed on the substrate using the seed layer.

The electroless Cu touch-up process thus transforms a non-continuous Cu seed layer into a suitable strike layer through a simple, quick, and cost-efficient manner. The resultant strike layer will then permit the use of higher BEOL dual damascene aspect ratios that will increase chip performance. Another advantage of this process is that existing PVD tool sets can be used and need not be replaced.

These and other features and advantages of the invention will become apparent upon a review of the following detailed description of the presently preferred embodiments of the invention, when viewed in conjunction with the appended drawings.

BRIEF DESCRIPTION OF THE DRAWINGS

FIG. 1 is a cross-sectional drawing of a semiconductor via or trench showing the electroless touch-up process of the invention, where

DESCRIPTION OF THE PRESENTLY PREFERRED EMBODIMENTS OF THE INVENTION

Figure 1A:
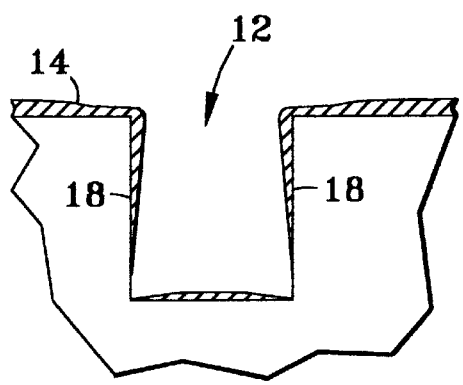
FIG. 1(a) shows the deposition of an initial Cu strike layer.
Figure 1B:
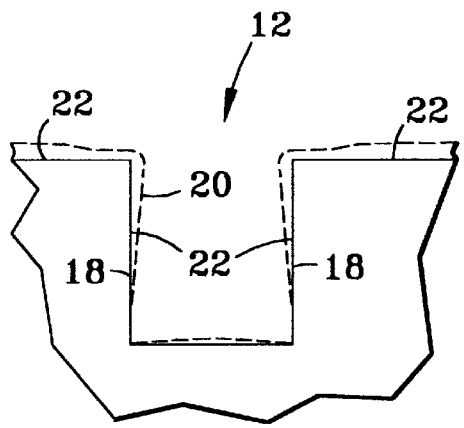
FIG. 1(b) shows the touch-up process in progress.
Figure 1C:
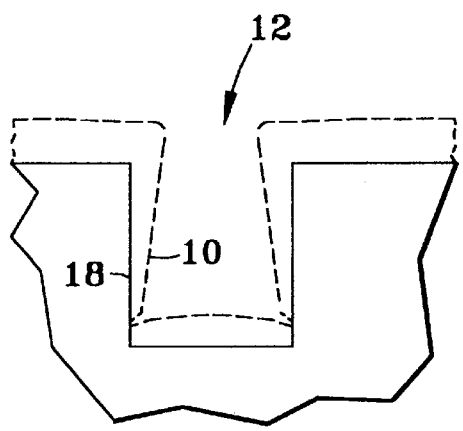
FIG. 1(c) shows the completed continuous Cu strike layer.

Reference is now made to the drawings where like elements receive like reference numerals throughout. FIG. 1 shows in cross-section the evolution of the formation of a continuous strike layer 10 in a high aspect-ratio feature 12 using the electroless touch-up process of the invention. In the preferred embodiment, Cu is used as the metallization layer although those skilled in the art will appreciate that other metals can be employed without departing from the essential spirit and scope of the invention. Referring first to FIG. 1(a), an initial Cu strike layer 14 is produced by a traditional directional deposition technique such that coverage is discontinuous along the bottom of via sidewalls 18. The evolution of the electroless touch-up process proceeds, as shown in FIG. 1(b), where the Cu layer 20 is grown conformally on all surfaces 22. The complete electroless touch-up, which produces a continuous Cu strike layer 10 for electroplating, is finally shown in FIG. 1(c).

Figure 2:
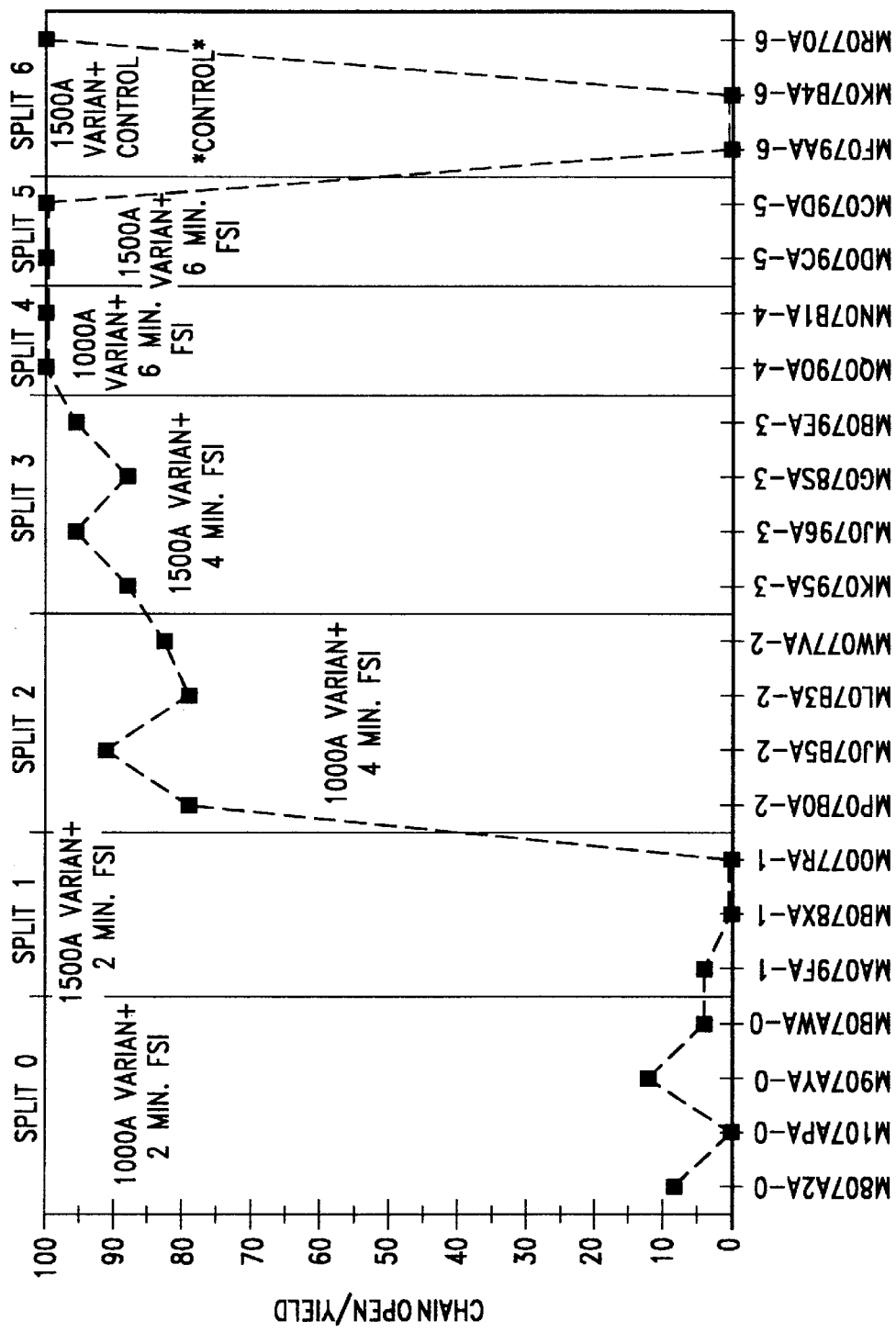
FIG. 2 is a first dual damascene via opens yield graph.

A series of tests were performed on the resultant strike layer 10 shown in FIG. 1(c). Referring to FIG. 2, a dual damascene via chain opens yield as a function of electroless touch-up time graph is provided. All initial discontinuous strike layers 14 in this first test were deposited on a Varian M2000 PVD tool using collimated physical vapor deposition (cPVD). Those skilled in the art will appreciate that any metal deposition tool can be employed to deposit the seed layer without departing from the essential spirit and scope of the invention. The initial strike layers 14 were either 1000A or 1500A in thickness. A six minute electroless touch-up was performed, which augmented the Cu thickness by ~500A conformally. This process resulted in increased opens yield from 0% (split 0) to 100% (splits 4 and 5), as follows:

Split 6 used a 1500A collimated PVD seed layer only (no touch-up) as a control. Since two wafers had 0% yield, seed coverage was clearly marginal. Split 1 started with a 1500A cPVD seed layer and used two minutes of electroless touch-up. Average opens was 2%. Split 2 used a 1000A cPVD seed layer having four minutes of electroless touch-up. Average opens yield was 84%. Split 3 used a 1500A cPVD seed layer with four minutes of electroless touch-up. Average opens yield was 93%. Split 4 used a 1000A cPVD seed layer and six minutes of electroless touch-up. Average opens yield went to 100%. Split 5 used a 1500A cPVD seed layer having six minutes of electroless touch-up. Average opens yield was again 100%.

Figure 3:
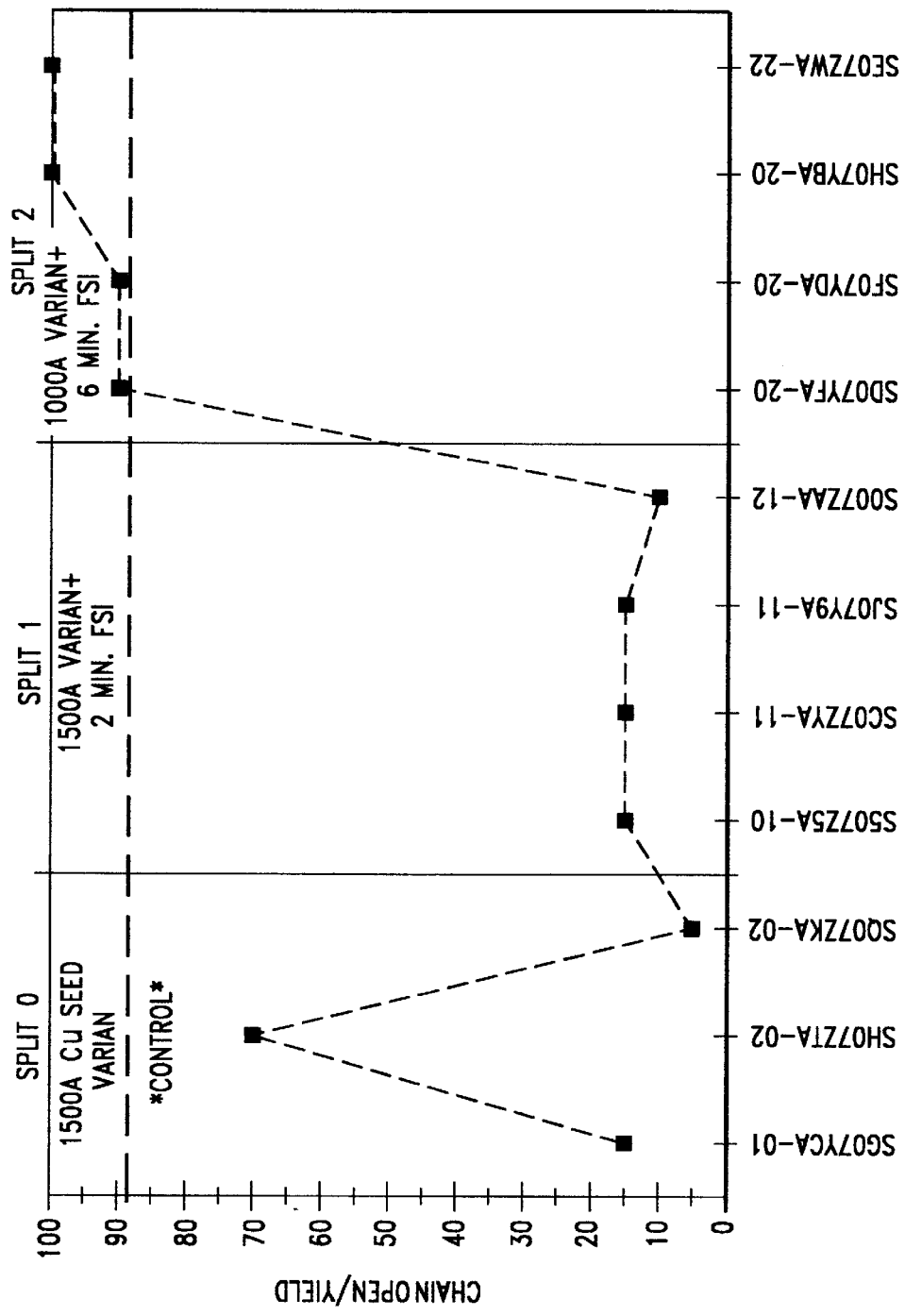
FIG. 3 is a second dual damascene via opens yield graph.

FIG. 3 also shows a second dual damascene via chain opens yield as a function of electroless touch-up time graph. All initial discontinuous strike layers 14 were again deposited on a Varian M2000 PVD tool using collimated physical vapor deposition (cPVD), and were either 1000A or 1500A in thickness. A six minute electroless touch-up was again used which augmented the Cu thickness by ~500A conformally. This variation increased the opens yield from an average of 30% (split 0) to an average of 98% (split 2) as follows:

Split 0 had a 1500A collimated PVD seed layer only (no touch-up) as a control. Since two wafers had less than 15% opens yield, seed coverage was again clearly marginal. Split 1 started with a 1500A cPVD seed layer and used two minutes of electroless touch-up. Average opens yield was 14%. Split 2 used a 1000A cPVD seed layer with six minutes of electroless touch-up. Average opens yield went to 98%.

Figure 4:
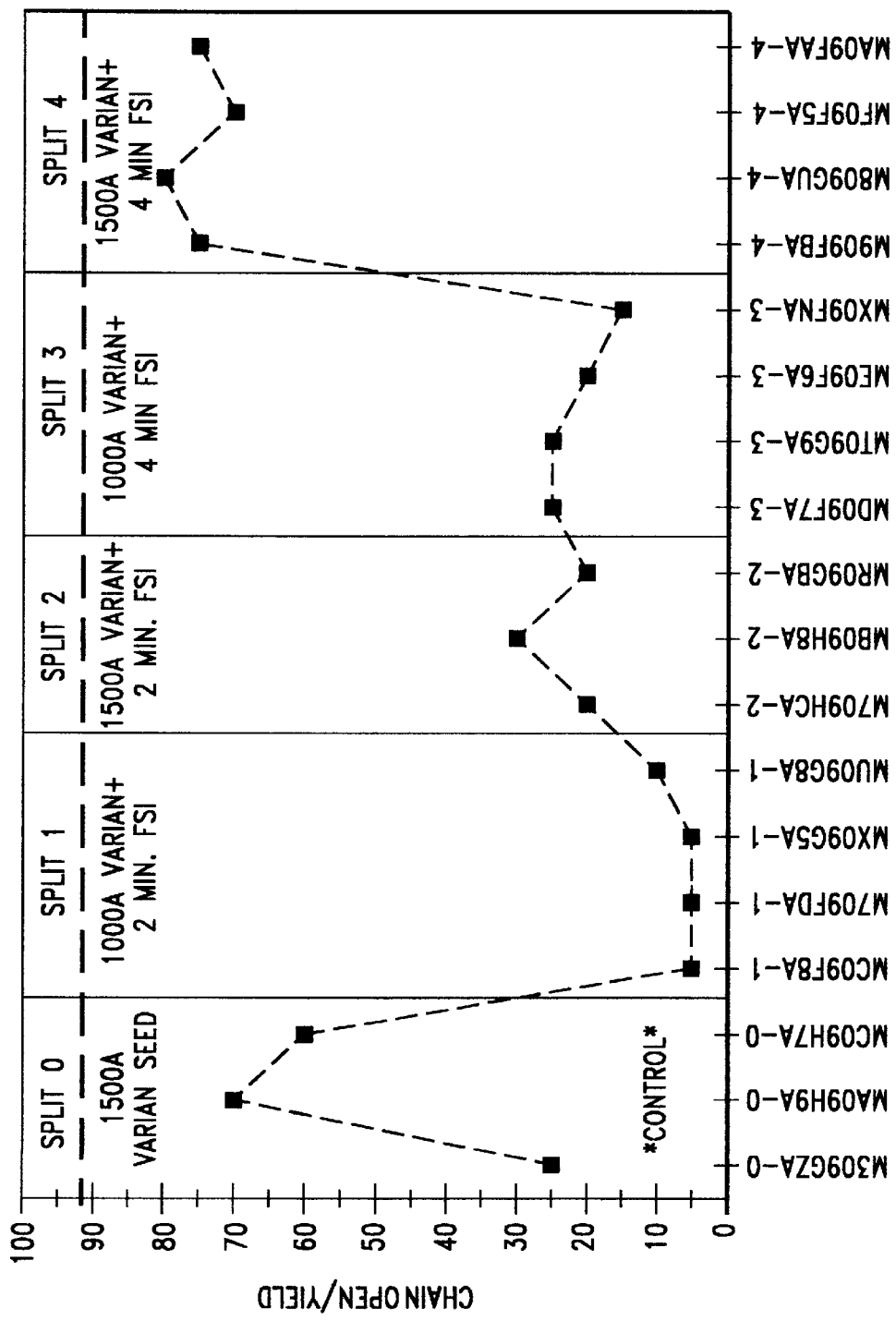
FIG. 4 is a third dual damascene via opens yield graph.

Finally, FIG. 4 shows a third dual damascene via chain opens yield as a function of electroless touch-up time graph. All initial discontinuous strike layers 14 were again deposited on a Varian M2000 PVD tool using collimated physical vapor deposition (cPVD), and were either 1000A or 1500A in thickness. A four minute electroless touchup process was used this time, which augmented the Cu thickness by only 300A conformally. This variation provided increased opens yield from an average of 51% (split 0) to 75% (split 4). Data in FIGS. 2 and 3 indicates that complete repair occurs after a six minute touch-up, which is in agreement with the data in FIG. 4. Split results for FIG. 4 were as follows:

Split 0 again used a 1500A collimated PVD seed layer only (no touch-up) as a control. Split 1 started with a 1000A cPVD seed layer and two minutes of electroless touch-up. Average opens yield was 6%. Split 2 used a 1500A cPVD seed layer having two minutes of electroless touch-up. Average opens yield was only 23%. Split 3 used a 1000A cPVD seed layer and had four minutes of electroless touch-up. Average opens yield was still only 21%. Split 4 used a 1500A cPVD seed layer combined with four minutes of electroless touch-up. Average opens yield grew to 75%.

Although FIGS. 2–4 show the thickness of the seed layer to be between 500 and 1500 Angstrom, those skilled in the art will appreciate that the above-described process can be applied to a range of seed layers from as low as 25 Angstrom up to at least 2000 Angstrom.

Electroless deposition is autocatalytic in nature, which means that the electrons required for the metal reduction are supplied by the simultaneous oxidation of a reducing agent in the solution, and not by an external current as with electrolytic plating. The following criteria therefore should be met in performing the electroless touch-up process: The process should be thermodynamically favorable (the redox potential of the reducing agent must be more negative than that of the metal being deposited), the metallizing surface should be energetically favorable for the oxidation of the reductant, and the metallizing surface should be electrically conducting for the transfer of the electrons to take place.

Because the electroless process occurs at relatively low temperatures (<80° C.) and the solution and tooling are inexpensive, the electroless touch-up process represents a low cost of ownership solution to producing robust Cu strike layers in high aspect-ratio BEOL dual damascene structures. The problem of obtaining a continuous Cu seed layer can also be solved by using other conformal seed layer deposition techniques, namely Cu chemical vapor deposition (CVD). Currently, Cu CVD manufacturers require a PVD Cu underlayer in their process flow. As a result, this step cannot be eliminated. Moreover, Cu CVD precursors and toolsets are more expensive (higher cost-of-ownership) than the chemicals and electroless Cu toolsets for the aforementioned touch-up process. Accordingly, the Cu PVD process described above is preferred from a cost/benefit perspective.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

We claim:

1. A method of repairing a non-continuous seed layer on a semiconductor substrate having a via or a trench, comprising the steps of:

depositing a seed layer by physical vapor deposition to a thickness of 25 to 2000 Angstroms on the surface of the semiconductor substrate, wherein the semiconductor substrate comprises at least one via or one trench;

coating the surface of the substrate with a solution including a reducing agent to cause a conformal layer of metal to deposit on a portion of the surface of the at least one via or one trench not covered by the seed layer; thereby repairing discontinuities in the seed layer in said at least one via or one trench deposited in said depositing step, said coating step being an electroless process; and performing an electroplating process on the substrate using the repaired seed layer.

2. The method defined in claim 1, wherein the coating step is performed at a temperature range of between room temperature and 200° C.

3. The method defined in claim 1, wherein the step of coating the substrate comprises a repetitive process of coating the substrate to build up a continuous strike layer.

* * * * *